United States Patent
Rao et al.

(10) Patent No.: US 7,558,145 B2
(45) Date of Patent: Jul. 7, 2009

(54) WORD LINE CONTROL FOR IMPROVING READ AND WRITE MARGINS

(75) Inventors: Setti Shanmukheswara Rao, Bangalore (IN); Biswa Bhusan Sahoo, Orissa (IN)

(73) Assignee: Infineon Technologies AG, Neubiberg (DE)

( * ) Notice: Subject to any disclaimer, the term of this patent is extended or adjusted under 35 U.S.C. 154(b) by 300 days.

(21) Appl. No.: 11/468,877

(22) Filed: Aug. 31, 2006

(65) Prior Publication Data

US 2008/0056053 A1 Mar. 6, 2008

(51) Int. Cl.
*G11C 8/16* (2006.01)
*G11C 11/41* (2006.01)
*G11C 11/413* (2006.01)

(52) U.S. Cl. ............. 365/230.05; 365/154; 365/189.09; 365/189.11; 365/230.06

(58) Field of Classification Search ................. 365/154, 365/189.09, 189.11, 230.05, 230.06; 711/131, 711/149
See application file for complete search history.

(56) References Cited

U.S. PATENT DOCUMENTS

| 5,907,508 | A | * | 5/1999 | Lattimore et al. ........... 365/154 |
| 5,936,973 | A | | 8/1999 | Lovett et al. |
| 6,335,900 | B1 | * | 1/2002 | Kwon et al. ........... 365/230.06 |
| 6,643,177 | B1 | | 11/2003 | Le et al. |
| 2003/0128609 | A1 | | 7/2003 | Derner et al. |
| 2004/0090818 | A1 | | 5/2004 | Liaw |
| 2005/0024949 | A1 | | 2/2005 | Hokari et al. |
| 2006/0103429 | A1 | | 5/2006 | Nonaka |
| 2006/0120125 | A1 | | 6/2006 | Kajigaya et al. |
| 2007/0030722 | A1 | * | 2/2007 | Chanussot et al. .......... 365/154 |

* cited by examiner

*Primary Examiner*—J. H. Hur
(74) *Attorney, Agent, or Firm*—Schwegman, Lundberg & Woessner, P.A.

(57) ABSTRACT

Apparatus to apply a voltage to the word line during a first time interval portion of the access cycle and to apply a further voltage to the word line during a further time interval portion of the access cycle and to apply the further voltage to a further word line during the first time interval portion of the access cycle and to apply the voltage to the further word line during the further time interval of the access cycle.

18 Claims, 6 Drawing Sheets

WORD LINE CONTROL FOR IMPROVING READ AND WRITE MARGINS

TECHNICAL FIELD

Embodiments of the present invention relate generally to operation of static memory devices and more particularly to methods and apparatus for writing data to and reading data from such devices.

BACKGROUND

Operating multi port static memory devices with low supply voltage can shrink the operating margin for reading and writing to the memory. Improving read and write margin would allow reliable operation of a memory at a lower supply voltage.

DETAILED DESCRIPTION

Memory designers are typically concerned with two aspects of operating performance: read margin and write margin. While conventional designs seek to improve read or write margin, doing so often requires a further power supply to be provided, a requirement which is difficult implement in embedded memory systems. In the embodiments described herein, read and write margins are improved using a self-timed bootstrapping circuit to increase word line voltage during read and write operations in a dual port memory.

Figure 1:
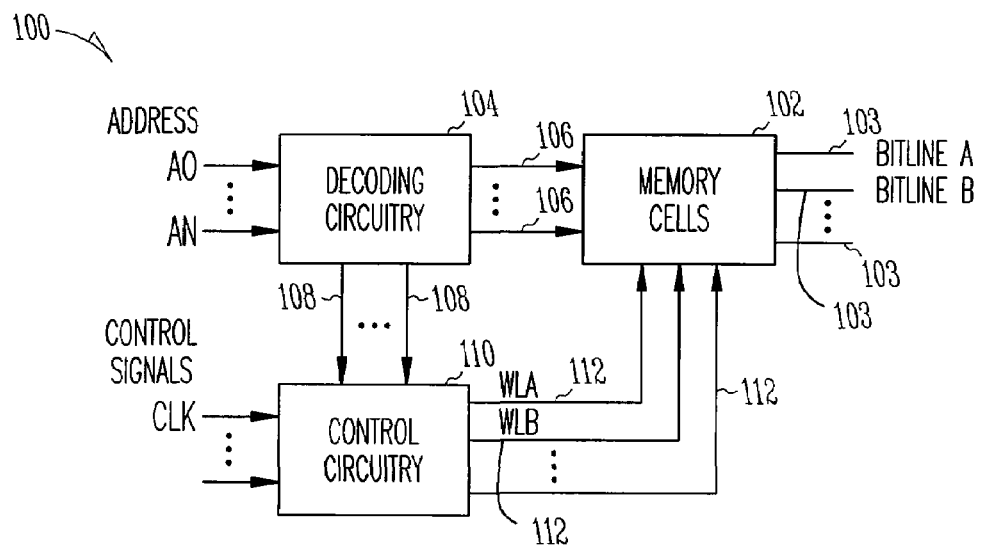
FIG. 1 shows a circuit in which embodiments of the invention may be used to improved read and write margin for a memory.

FIG. 1 is a block diagram of an apparatus and system 100 for reading and writing to a static memory. The block diagram shows a portion 100 of a multiple port static memory access circuit for reading information from memory cell storage node locations in a memory 102 to bit lines 103 during an access cycle. Memory 102 receives row and column selecting inputs from decoder circuitry 104 which receives address signals $A_o$ to $A_n$ and delivers bit line signals 106 to memory 102 and also delivers word line signals 108 to control circuit 110.

The division of the circuits into blocks such as 102, 104 and 110 is, it will be appreciated, somewhat arbitrary and is done for the purposes of explanation of an embodiment of the invention without implying that the circuit is a part of a separate circuit just because it is enclosed by a separate box. Thus it is entirely proper to refer, in some embodiments to control circuitry 110 as a part of the memory cells 102 rather than as a separate box 110.

In some embodiments, memory 102 is a multiple port memory such as a dual port memory. In some embodiments memory 102 is a multiple port memory having two or more ports. In some embodiments memory 102 is a multiple port memory having n ports. In a multiple port memory, multiple read and write operations occur at the same time, or nearly the same time.

Control circuit 110 also receives clock input signals CLK and delivers memory access word line signals WLA, WLB through WLAn to memory 102 over word lines 112 which are coupled to selected memory cells of memory 102. In the multiple port system embodiment shown in FIG. 1, outputs from memory 102 are delivered as bit signals on bit lines 103 which are individually designated as BIT LINE A, BIT LINE B through BIT LINE n.

Control circuit 110 is shown providing word line signals WLA and WLB through WLn on word lines 112. Those word line signals are in turn used to drive memory with a signal which is directed to a selected memory cell by column and row select decoder circuitry 110. In existing systems, the level of the word line is set to a normal $V_{DD}$ value for all of the ports during activation.

In static memory systems the read and write characteristics of core cells can vary and the variations may lead to read and write failures. Write fails can occur if the drive current of the access transistor reduces compared to the load transistor. During double read access, in a dual port system, if the A port drive current decreases, the B port drive current increases and the driver transistor drive current decreases, then read margin will reduce and in turn is likely to trigger read fails.

In earlier attempts to improve margins and thereby avoid read and write failures, it has been known to reduce the core cell power supply level of a selected column to improve the write margin. In those approaches, the power supply of the selected column is switched to a low ($V_{DD}$ minus $V_{PD}$) and all other, unselected, columns were either left at normal $V_{DD}$ or switched to a higher $V_{DD}$ using a column select circuit. While such arrangements could improve write margin by improving the access transistor drive current of a selected core cell, the improvement required an additional power supply to be provided.

Increases in read margin have also been obtained by switching the power supply of the core-cells within a selected row to a higher value ($V_{DD}$ plus $V_{PD}$) and the power supply of the unselected rows is switched to a lower $V_{DD}$. This approach could improve the read margin of a selected core cell at the expense of requiring an additional power supply.

Figure 2:
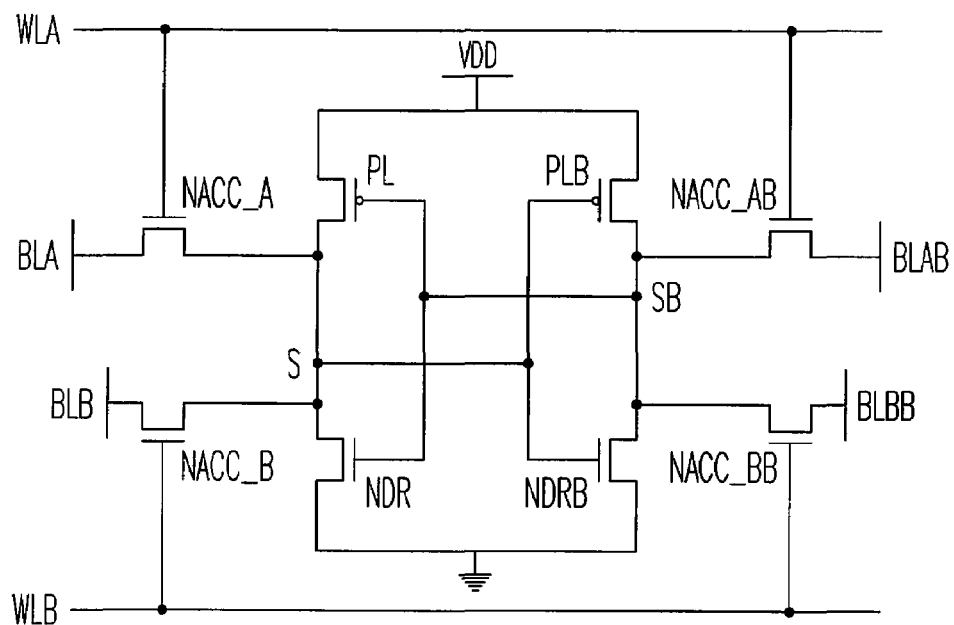
FIG. 2 is a more detailed schematic of a word line control circuit for a two ports of a multiple port system according to some embodiments and FIG. 3 is an illustration of voltage waveforms in that circuit.
Figure 3:
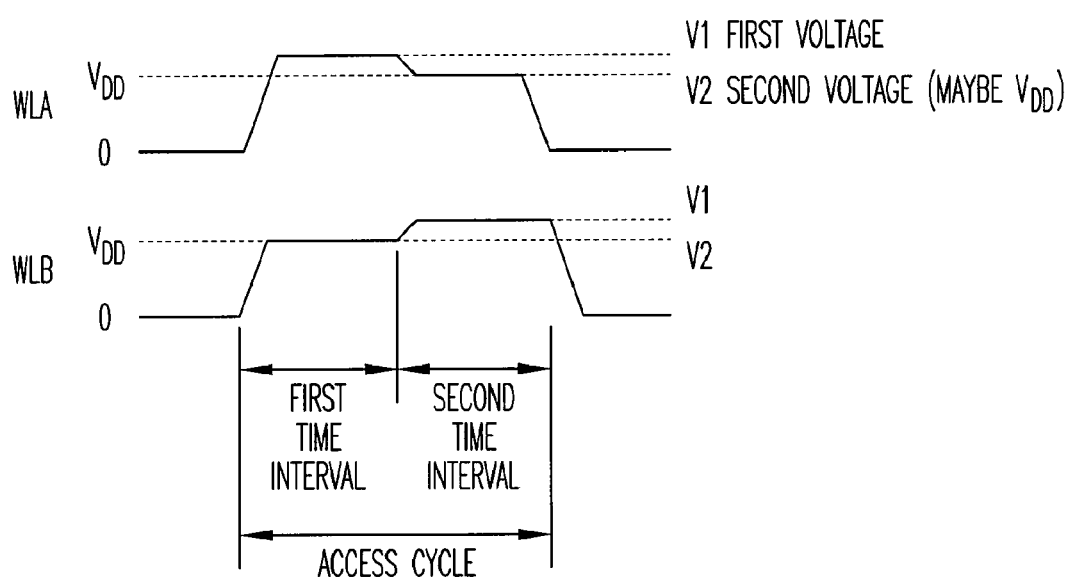

FIG. 2 is a schematic drawing illustrating a part of control circuit 10 for a multiple port system having at least ports A and B. FIG. 3 illustrates word line waveforms according to embodiments of the invention in which the word lines of both portA and portB are boosted at first and second time interval portions of an access cycle. The time interval portions of an access cycle are also referred to as tboostA and tboostB. In some embodiments the first and second time interval portions are de-correlated so that they are substantially non-overlapping.

The boosted word line techniques of embodiments disclosed herein are memory architectures in which word line voltage for a selected cell is increased above external core $V_{DD}$ during a portion of an access cycle.

The circuit in FIG. 2 provides Bit line signals BLA and BLB for port A and BLAB and BLBB for port B. It provides drive signals at terminals marked S and SB for memory ports A and B respectively of memory 102. The circuit in FIG. 2 receives word line voltages WLA and WLB.

In some embodiments of the invention, the WLA and WLB voltages are modified from $V_{DD}$ in accordance with the waveforms illustrated in FIG. 3 for a memory access cycle comprised of a time interval and at least one further time interval. FIG. 3 shows, in the waveform WLA, a voltage V1 to apply to word line A during a time interval portion tboost A of the access cycle and a further voltage V2 to apply to word line A during a further time interval portion tboostb of the access cycle. FIG. 3 also shows, in the waveform WLB, the further voltage V2 to apply to word line B during the time interval portion tboostA of the access cycle and the voltage V1 to apply to word line B during a further time interval tboostB of the access cycle.

The application of the modified WLA and WLB voltages increases the drive at the gate of the portA access transistor NACC_A above $V_{DD}$ during tboostA and increases the drive at the gate of the portB access transistor NACC_B above $V_{DD}$ during tboostB. This increases the drive current of NACC_A and NACC_B compared to load transistor PL and ensures sufficient write margin to reduce write failures in write operations through portA and portB. Also, during the read cycle, the increased WLA and WLB voltages will discharge the bit lines at a faster rate in order to provide a sufficient read margin to reduce read failures.

Figure 4:
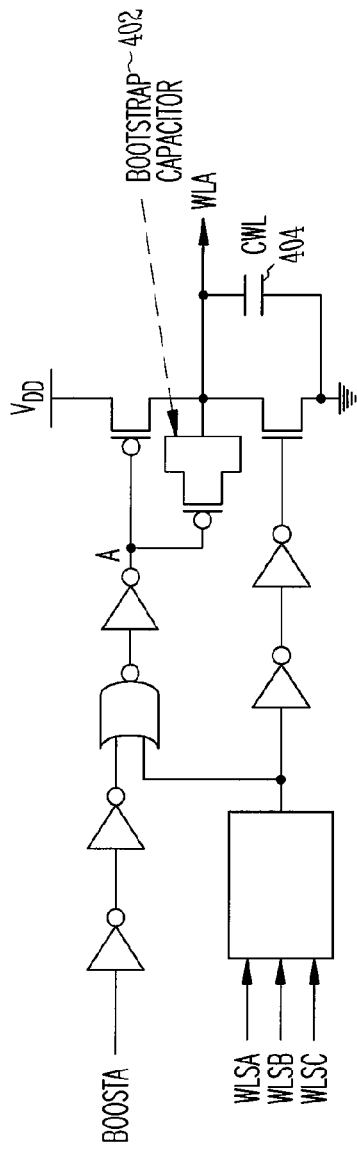
FIG. 4 illustrates a circuit for word line boot strapping according to embodiments of the invention and FIG. 5 illustrates voltage waveforms in that circuit according to some embodiments of the invention.
Figure 5:
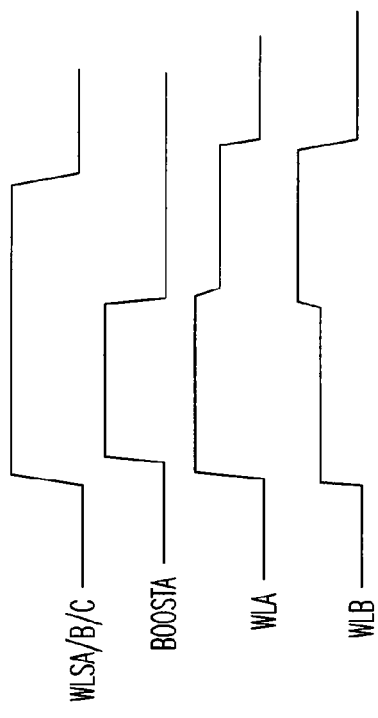

FIG. 4 is a circuit to apply modified word line voltages to word lines in some embodiments of the invention. When the decoder outputs (WLSA and WLSB, as shown for the dual port embodiment of FIG. 5) are set to high and BOOSTA is set to low, node 'A' discharges to low and WLA charges to $V_{DD}$. Once BOOSTA is set to high as the first time interval portion of the access cycle commences, node 'A' charges to $V_{DD}$ and WLA increases above $V_{DD}$ due to a charge coupling effect between bootstrap capacitor 402 (actually, in some embodiments the gate channel capacitance of an insulated gate FET) and word line capacitor 404 (CWL). When BOOSTA is set to low at the end of the first time interval of the access cycle, WLA returns to $V_{DD}$. An analogous sequence of events is carried out by a similar circuit for portB during the second time interval portion of the access cycle when a BOOSTB pulse is generated as discussed below.

In multiple port embodiments having n ports, where n is more than 2, the access cycle is divided into 1/n time interval portions where each portion has a width is approximately 1/n of the duration of the access cycle.

Figure 6:
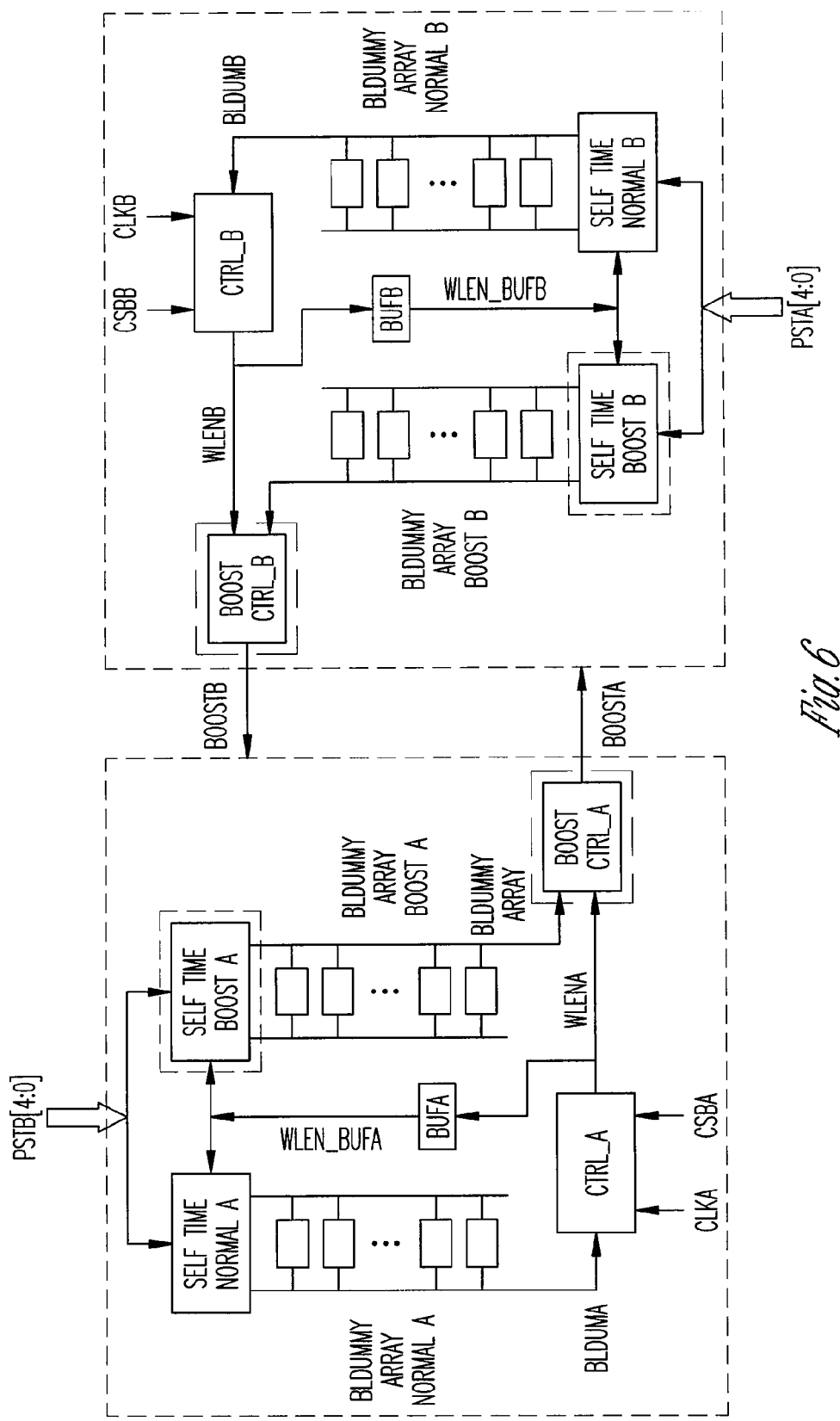
FIG. 6 a schematic view of a self timed boost control according to embodiments of the invention.
Figure 7:
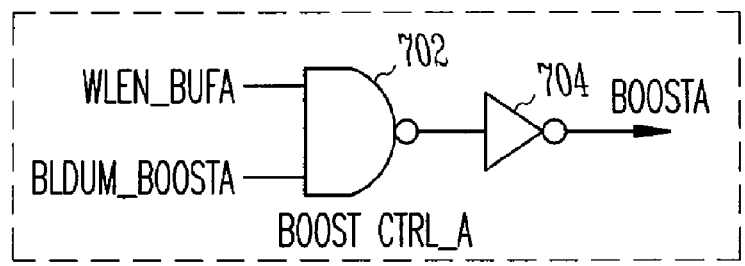
FIGS. 7 and 8 are illustrations of circuits used to generate the BOOSTA and BOOSTB control signals for some embodiments of the invention.
Figure 8:
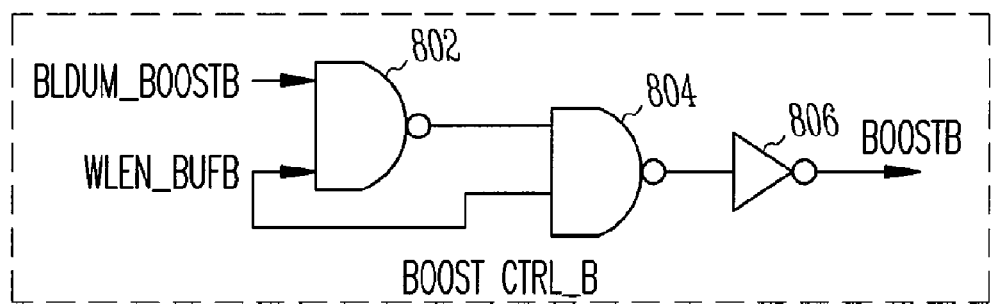

FIG. 6 is a circuit for a self-timed circuit for an dual port embodiment of the invention associated with control circuit 110 to generate BOOSTA and BOOSTB signals to control word line boost durations for portA and portB at different time slots with an approximately 50% duty cycle. In a three port system embodiment, BOOSTA, BOOSTB and BOOSTC signals will be generated with each pulse having an approximately 33% duty cycle. The circuit includes dummy bit line arrays "Self-Time Normal A" and "Self-Time Boost A" which run at an accelerated rate such that their bit lines are discharged at a faster rate than the normal dummy bit lines, to ensure the same pulse width and precise de-correlation between BOOSTA and BOOSTB signals. In a dual port system, the slew rate is double that of the normal dummy bit line and in a triple port system, the bit rate is triple that of the normal dummy bit line. FIGS. 7 and 8 show circuit details of the Boost CTRL_A and Boost CTRL_B circuit blocks shown in FIG. 6.

Figure 9:
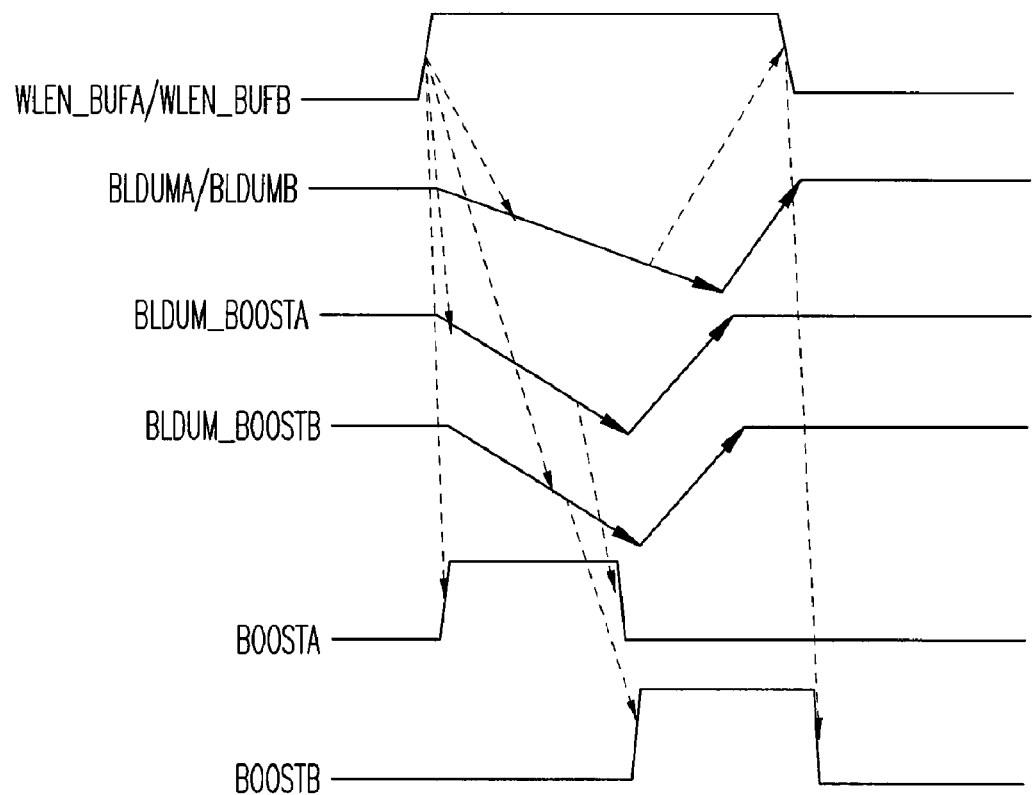
FIG. 9 illustrates the relationship of various signals used in the circuit s of some embodiments of the invention.

The operation of the circuit of FIGS. 6-8 can be better understood with reference to the waveforms illustrated in FIG. 9. The signals WLEN_BUFA and WLEN_BUFB are timing signals which, when high, define the duration of an access cycle. The signals BLDUMA and BLDUMB are the signals on dummy normal word lines A and B. The BLDUM_BOOSTA and BLDUM_BOOSTB signals are the bit line signals on bitline Boost A and Boost B dummy arrays.

When the WLEN_BUFA and BLDUM_BOOSTA signals are applied to the two inputs of NAND gate 802, the output of that gate is initially low when WLEN_BUFA is high and while BLDUM_BOOSTA remains high. As BLDUM_BOOSTA decreases as shown in FIG. 9, the output of NAND gate 802 switches from low to a high and the BOOST A signal switches accordingly from a high to a low signal to end the tboosta time interval.

When the WLEN_BUFB and BLDUM_BOOSTB signals are applied to the two inputs of NAND gate 802, its output changes from a low to a high when WLEN_BUFB is high and while BLDUM_BOOSTB remains high to commence the tboostb time interval. As BLDUM_BOOSTB decreases as shown in FIG. 9. the output of NAND gate 802 switches from a low to a high signal, thereby switching NAND gate 804 from a high to a low signal and the output of inverter 806 from a low to a high to commence the tboostb interval which ends a WLEN_BUFB switches from a high to a low signal.

Using the embodiments discussed above selected bitlines (BLA or BLAB) of portA and portB (BLB or BLBB) are discharged to ground level and the word line of portA is boosted above $V_{DD}$ by keeping the word line of portB at $V_{DD}$ for 50% of the WL activation time, which leads to increased transistor drive current of portA compared to the PMOS (PL) load transistor. As a consequence, the bitline of portA is able to force the desired data into the core-cell during write, which in turn eliminates the write fails for portA.

After writing to portA, the portA word line is brought back to $V_{DD}$ and the portB word line will be boosted for the next 50% of word line activation time which helps in improving the portB access transistor drive current compared to the PMOS load transistor (PL), which in turn eliminates write fails by forcing the desired data into the selected core cell through portB. In case of a dual read from the same location, the pre-charge of the selected bit lines is disabled for both portA and portB and the word line of portA is boosted above $V_{DD}$ by maintaining the word line of portB at $V_{DD}$ for 50% of WL activation time which strengthens access transistor of portA and discharges bitline of portA at a faster rate to improve the read margin of portA. In the second time interval portion of the access cycle the portA word line is brought back to $V_{DD}$ and the portB word line will be boosted for the second time interval portion of the word line activation time, which strengthens the access transistor of portB and discharges the bitline of portB at faster rates and hence improves the read margin for portB.

Using the boosted word line control as shown in the embodiments described above, the read and the write margins of the memory are improved for low voltage operation without requiring addition of a further power supply to provide reduced core $V_{DD}$ of a selected column to improve write margin at the cost of increased complexity and possibly two power supplies. Similarly, systems where core $V_{DD}$ is increased for selected rows to improve read margin does not reduce the occurrence of write fails.

Embodiments of the invention control word line boost duration for portA and portB at different time interval portions to avoid core cell instability within the selected row. Embodiments of the invention provide the word line boost from a bootstrap capacitor inside the decoder. The word line boost duration of portA and portB is controlled accurately by self-timing circuitry.

Embodiments of the invention resolve both read and write failures by improving both read and write margin by providing self timed boost pulses for portA and portB at different time slots and generating the increased voltage with a word line bootstrapping circuit which eliminates the need for an additional power supply.

Although the embodiments discussed above were in a dual port structure, it can be seen that other embodiments can readily be constructed for three or more ports using the same bootstrap circuitry and by setting the duty cycle of the boost time interval at one third of the word line activation time so that the boost is applied to one port at a time while the other two ports are unboosted during the same time interval. In embodiments where n ports are used, each of the ports is boosted in sequence from $V_{DD}$ to the boost voltage during an interval which is 1/n of the access cycle.

Implementing the apparatus, systems, and methods disclosed herein may operate to improve read and write margins of static memories used in computing and communications platforms, among others, in both stationary and mobile devices. Battery life may also be extended over more conventional solutions due to higher reliability efficiency under varying load conditions.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. Apparatus, comprising:
a supply node to receive a supply voltage of $V_{DD}$;
a memory cell coupled to the supply node and including a storage node;
decoder circuitry coupled to the memory cell to initiate an access cycle to transfer data;
a first word line coupled to the memory cell to enable a transfer of data between the storage node and a bit line during the access cycle;
at least one further word line coupled to the memory cell to enable a transfer of data between the storage node and a further bit line during the access cycle; and
a control circuit responsive to the decoder circuitry to divide the access cycle into at least two time interval portions and to apply a first voltage, higher than the supply voltage, to the first word line during a first time interval portion of the access cycle and to apply a second voltage, lower than the first voltage, to the first word line during a second time interval portion of the access cycle and to apply the second voltage to the at least one further word line during the first time interval portion of the access cycle and to apply the first voltage to the at least one further word line during the second time interval portion of the access cycle.

2. The apparatus of claim 1, wherein the second voltage is the supply voltage.

3. The apparatus of claim 1, wherein the first voltage is the supply voltage plus an incremental voltage derived from coupling a precharge voltage from a bootstrap capacitor when the first voltage is applied to a word line.

4. The apparatus of claim 3, wherein the word line has an input capacitor which is charge coupled to the bootstrap capacitor when the first voltage is applied to the word line.

5. The apparatus of claim 1, wherein the at least one further word line comprises second and third word lines and the control circuit is to divide the access cycle into three time interval portions and also to apply the second voltage to the first word line during the third time interval portion and to apply the second voltage to the second word line during the third time interval portion and to apply the first voltage to the third word line during the third time interval portion of the access and to apply the second voltage to the third word line during the first and second time interval portion of the access cycle.

6. The apparatus of claim 1, wherein the control circuit includes a bootstrap capacitor for each word line, each bootstrap capacitor to be charged during the time interval portion that the first voltage is applied to its respective word line and to be coupled to apply its voltage to a word line capacitor coupled between the respective word line and a source of reference potential.

7. The apparatus of claim 1 wherein the second voltage is $V_{DD}$.

8. Apparatus, comprising:
a supply node to receive a supply voltage;
a memory cell coupled to the supply node and including a storage node;
decoder circuitry coupled to the memory cell to initiate an access cycle to transfer data;
a first word line coupled to the memory cell to enable a transfer of data between the storage node and a bit line during the access cycle;
at least one further word line coupled to the memory cell to enable a transfer of data between the storage node and a further bit line during the access cycle; and a control circuit responsive to the decoder circuitry to divide the access cycle into at least two time interval portions and to apply a first voltage, higher than the supply voltage, to the first word line during a first time interval portion of the access cycle and to apply a second voltage, lower than the first voltage, to the first word line during a second time interval portion of the access cycle and to apply the second voltage to the at least one further word line during the first time interval portion of the access cycle and to apply the first voltage to the at least one further word line during the second time interval portion of the access cycle, wherein the control circuit includes bit line dummy arrays discharged at a faster slew rate than the normal dummy bit lines to divide the access cycle into at least two substantially equal time interval portions.

9. A method, comprising:

providing separate word line signals to word line inputs of each port of an n port static memory during an access cycle which is divided into a time interval portion for each port, the memory powered by a supply voltage of $V_{DD}$;

sequentially modifying each word line signal during its time interval portion by boosting its word line voltage to a voltage larger than the supply voltage during that port's time interval portion of the access cycle while the other word line signals remain at a lower voltage.

10. The method of claim 9, wherein the lower voltage corresponds to the supply voltage.

11. The method of claim 9, wherein the time interval portion for each port is approximately 1/n of the access cycle.

12. The method of claim 9, wherein the voltage larger than the supply voltage is applied by charge coupling a precharged boost capacitor to a word line capacitor during the time interval portion for each word line.

13. A system, comprising:

an input device;

a display device;

a processor coupled to the input device to receive input data;

a memory device including supply node to receive a supply voltage of $V_{DD}$ and a memory cell coupled to the supply node and including a storage node; decoder circuitry coupled to the memory cell to initiate an access cycle to transfer data;

a first word line coupled to the memory cell to enable a transfer of data between the storage node and a bit line during the access cycle; at least one further word line coupled to the memory cell to enable a transfer of data between the storage node and a further bit line during the access cycle; and a control circuit to write data into the memory and read data from the memory, the control circuit responsive to the decoder circuitry to divide the access cycle into at least two time interval portions and to apply a first voltage, higher than the supply voltage, to the first word line during a first time interval portion of the access cycle and to apply a second voltage, lower than the first voltage, to the first word line during a second time interval portion of the access cycle and to apply the second voltage to the at least one further word line during the first time interval portion of the access cycle and to apply the first voltage to the at least one further word line during the second time interval portion of the access cycle.

14. The system of claim 13, wherein the second voltage is the supply voltage.

15. The system of claim 13, wherein the first voltage is the supply voltage plus an incremental voltage derived from coupling a precharge voltage from a bootstrap capacitor when the first voltage is applied to a word line.

16. The system of claim 13, wherein the word line has an input capacitor which is charge coupled to the bootstrap capacitor when the first voltage is applied to the word line.

17. The system of claim 13, wherein the at least one further word line comprises second and third word lines and the control circuit is to divide the access cycle into three time interval portions and also to apply the second voltage to the first word line during the third time interval portion and to apply the second voltage to the second word line during the third time interval portion and to apply the first voltage to the third word line during the third time interval portion of the access and to apply the second voltage to the third word line during the first and second time interval portion of the access cycle.

18. The system of claim 13, wherein the control circuit includes bit line dummy arrays discharged at a faster slew rate than the normal dummy bit lines to divide the access cycle into at least two substantially equal time interval portions.

* * * * *